(12) United States Patent
Parikh

(10) Patent No.: US 7,061,331 B2
(45) Date of Patent: Jun. 13, 2006

(54) CLOCK GENERATION CIRCUITS PROVIDING SLEWING OF CLOCK FREQUENCY

(75) Inventor: Parag Parikh, Allentown, PA (US)

(73) Assignee: Agere Systems Inc., Allentown, PA (US)

(*) Notice: Subject to any disclaimer, the term of this patent is extended or adjusted under 35 U.S.C. 154(b) by 98 days.

(21) Appl. No.: 10/770,046

(22) Filed: Feb. 2, 2004

(65) Prior Publication Data

US 2005/0168290 A1 Aug. 4, 2005

(51) Int. Cl.
*H03L 7/00* (2006.01)

(52) U.S. Cl. ............................. 331/16; 331/45; 331/57; 331/74; 331/34; 375/376; 327/156

(58) Field of Classification Search .................. 331/74, 331/16, 18, 45, 57; 375/376; 327/156
See application file for complete search history.

(56) References Cited

U.S. PATENT DOCUMENTS 6,114,914 A * 9/2000 Mar .............................. 331/16
6,356,132 B1 * 3/2002 Mastrocola et al. ........ 327/276
6,606,005 B1 8/2003 Chang .......................... 331/78

OTHER PUBLICATIONS

U.S. Appl. No. 10/644,362, filed Aug. 20, 2003, Paist et al.

* cited by examiner

*Primary Examiner*—Arnold Klnkead

(57) ABSTRACT

Techniques are described for slewing a clock frequency of a clock signal from an initial clock frequency to a final clock frequency. An oscillator provides a number of phase outputs. A current frequency divider value is set to an initial frequency divider value, the initial frequency divider value corresponding to the initial clock frequency. A period of a feedback signal is modified through a number of periods from an initial period to a final period, utilizing one or more of the phase outputs. The current frequency divider value is changed when the period of the feedback signal reaches the final period. The modify and change operations are performed until the current frequency divider value reaches a final frequency divider value, where the final frequency divider value corresponds to the final clock frequency.

31 Claims, 9 Drawing Sheets

FIG. 6

| FRACTIONAL M |
|---|
| 50 |
| 49.875 |
| 50 |
| 50 |
| 50 |
| 49.875 |
| 49.875 |
| 50 |
| 50 |
| 49.875 |
| 49.875 |
| 49.875 |
| 49.875 |
| 49.875 |
| 49.875 |
| 49.875 |

610 { (rows 1-4)
620 { (rows 5-8)
630 { (rows 9-12)
640 { (rows 13-16)

| M | PHASE |
|---|---|
| 50 (0) | 1 |
| 49 (−1) | 8 |
| 50 (0) | 7 |
| 50 (0) | 6 |
| 50 (0) | 5 |
| 50 (0) | 4 |
| 50 (0) | 3 |
| 50 (0) | 2 |
| 50 (0) | 1 |
| 49 (−1) | 8 |

710:

| M | PHASE | |
|---|---|---|
| 50 (0) | 1 | 717-1 |
| 50 (0) | 2 | 717-2 |
| 50 (0) | 3 | 717-3 |
| 50 (0) | 4 | 717-4 |
| 50 (0) | 5 | 717-5 |
| 50 (0) | 6 | 717-6 |
| 50 (0) | 7 | 717-7 |
| 50 (0) | 8 | 717-8 |
| 51 (+1) | 1 | 717-9 |
| 50 (0) | 2 | 717-10 |

FIG. 8

```verilog
                module dn_to_up_profile    ( // Inputs
                        slew_up, Pll_Clk_Early, RESET,
                        IN_MOFSET2, IN_MOFSET1, IN_MOFSET0,
                        IN_SELPH3, IN_SELPH2, IN_SELPH1, IN_SELPH0,
                        // Outputs
                        OUT_MOFSET2, OUT_MOFSET1, OUT_MOFSET0,
                        OUT_SELPH3, OUT_SELPH2, OUT_SELPH1, OUT_SELPH0
                        );
input       slew_up;            // Active high control. Outputs=inputs if slew_up=0.
input       Pll_Clk_Early;      // Clock.
input       RESET;              // Active high reset.
input       IN_MOFSET2;         // The M bits.
input       IN_MOFSET1;
input       IN_MOFSET0;
input       IN_SELPH3;          // Expect always 0 so not sampled.
input       IN_SELPH2;          // The phase bits.
input       IN_SELPH1;
input       IN_SELPH0;

output      OUT_MOFSET2;        // The M bits.
output      OUT_MOFSET1;
output      OUT_MOFSET0;
output      OUT_SELPH3;         // Always 0.
output      OUT_SELPH2;         // The phase bits.
output      OUT_SELPH1;
output      OUT_SELPH0;

reg [2:0]   last_selph;
reg [2:0]   local_selph;
wire[2:0]   current_selph;

always @( IN_SELPH2 or IN_SELPH1 or IN-SELPH0 )
    begin
            // 2s-complement implementation
            case ( {IN_SELPH2, IN_SELPH1, IN_SELPH0} )
                3'b000 : local_selph = 3'b000;
                3'b001 : local_selph = 3'b111;
                3'b010 : local_selph = 3'b110;
                3'b011 : local_selph = 3'b101;
                3'b100 : local_selph = 3'b100;
                3'b101 : local_selph = 3'b011;
                3'b110 : local_selph = 3'b010;
                3'b111 : local_selph = 3'b001;
            endcase // case( {IN_SELPH2, IN_SELPH1, IN_SELPH0} )
    end // always @ ( IN-SELPH2 or IN_SELPH1 or IN_SELPH0 )
```

FIG. 8 cont.

```
assign    current_selph[2] = slew_up ? local_selph[2] : IN_SELPH2;
assign    current_selph[1] = slew_up ? local_selph[1] : IN_SELPH1;
assign    current_selph[0] = slew_up ? local_selph[0] : IN_SELPH0;

always @( posedge RESET or posedge Pll_Clk_Early)
   begin
         if ( RESET == 1'b1 )
             begin
                 last_selph <= 4'b0000;
             end
         else
             begin
                 last_selph <= current_selph;
             end end // always @ ( posedge RESET or posedge Pll_Clk_Early)

assign    OUT_SELPH3 = slew_up ? 1'b0 : IN_SELPH3;
assign    OUT_SELPH2 = slew_up ? local_selph[2] : IN_SELPH2;
assign    OUT_SELPH1 = slew_up ? local_selph[1] : IN_SELPH1;
assign    OUT_SLEPH0 = slew_up ? local_selph[0] : IN_SELPH0;

// MOFSET for slewing up will be either 000 or 001, depending
// on whether the phase has just rolled over from 7 to 0.
assign    OUT_MOFSET2 = slew_up ? 1'b0 : IN_MOFSET2;
assign    OUT_MOFSET1 = slew_up ? 1'b0 : IN_MOFSET1;
assign    OUT_MOFSET0 = slew_up ? ( ( (last_selph > local_selph) ||
                          ((last_selph == local_selph) &&
                           (IN_MOFSET2 == 3'b1) &&
                           (IN_MOFSET1 == 3'b0) &&
                           (IN_MOFSET0 == 3'b1) ) )
                             ? 1'b1 : 1'b0 ) : IN_MOFSET0;
endmodule
```

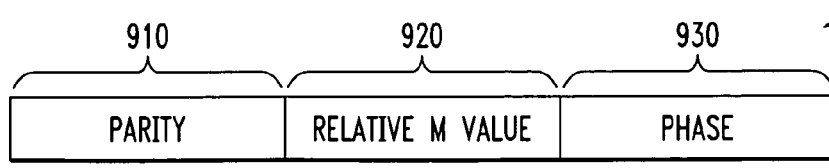

FIG. 9

CLOCK GENERATION CIRCUITS PROVIDING SLEWING OF CLOCK FREQUENCY

CROSS REFERENCE TO RELATED APPLICATIONS

The present application is related to a patent application by Kenneth Paist and Parag Parikh, entitled "Spectrum Profile Control for a PLL and the Like," U.S. patent application Ser. No. 10/644,362, filed on Aug. 20, 2003, the disclosure of which is hereby incorporated by reference.

FIELD OF THE INVENTION

The present invention relates generally to electronic systems, and more particularly, to clock generation in electronic systems.

BACKGROUND OF THE INVENTION

Many electronic systems use a clock signal that is provided to the components of the electronic system. Ideally, a single clock frequency is created by a clock generation circuit and provided, via the clock signal, to the components.

With the rise in use of mobile devices, power has become an important concern. Manufacturers of electronic systems have tried to increase performance as well as extend battery life. Even non-mobile devices have been designed to use less power, particularly during idle times.

One technique used to save power is to have clock generation circuits capable of producing multiple clock frequencies. However, many clock generation circuits can become unstable during transitions between clock frequencies. Consequently, the clock signal of such a clock generation circuit is generally turned off for a certain time period after a transition between clock frequencies. The time period is chosen to ensure that the clock generation circuit has transitioned to a new frequency and has a stable output. During this time period, the electronic system is essentially frozen, as nothing will be input to or output from the system.

Nonetheless, the above technique allows clock frequency in the electronic system to be increased or decreased. During a need for high speed operation, such as during normal use of the electronic system, the clock frequency is increased, generally to about a maximum frequency. During idle times or at other times where high speed operation is not necessary, the clock frequency is decreased, generally to a speed conducive for lower power.

Although techniques exist for changing clock frequency in an electronic system, a need still exists for techniques that can more smoothly change clock frequency.

SUMMARY OF THE INVENTION

Generally, clock generation circuits and methods of use thereof are described that provide slewing of clock frequency. During slewing of clock frequency, the clock generation circuit can produce a stable output, which means that components receiving to a clock signal having the clock frequency can be used, if desired, during slewing.

In an exemplary aspect of the invention, techniques are described for slewing a clock frequency of a clock signal from an initial clock frequency to a final clock frequency. An oscillator provides a number of phase outputs. A current frequency divider value is set to an initial frequency divider value, the initial frequency divider value corresponding to the initial clock frequency. A period of a feedback signal is modified through a number of periods from an initial period to a final period, utilizing one or more of the phase outputs. The current frequency divider value is changed when the period of the feedback signal reaches the final period. The modify and change operations are performed until the current frequency divider value reaches a final frequency divider value, where the final frequency divider value corresponds to the final clock frequency.

In an exemplary implementation, a fractional modulator of a clock generation circuit performs the previously described techniques. Additionally, a number of feedback dividers are coupled to the phase outputs of the oscillator and each feedback divider divides, by using a frequency divider value provided by the fractional modulator, a frequency of a corresponding one of the phase outputs to create a divided phase output. The divided phase outputs are coupled to a multiplexer, which selects one of the divided phase outputs under direction of the fractional modulator. The selected divided phase output is the feedback signal and is coupled to other elements of a clock generation circuit.

In another exemplary aspect of the invention, the period modification is effected by selecting one of the number of phase outputs of the oscillator. The phase outputs are selected so that changes of one or more phases on the feedback signal are effected, and the phase changes cause modification of the period of the feedback signal. The modification in period causes a modification of frequency of the clock signal, as the feedback signal is used during production of the clock signal. During certain phase selections of the phase outputs, a frequency divider value is changed in order to modify the period of the feedback signal or to maintain the period of the feedback signal.

In another exemplary aspect of the invention, a memory comprises entries having values used to select the phase outputs of the oscillator and values used to select corresponding frequency divider values. The values are used when modifying the period of the feedback signal. The frequency divider values may be stored using values relative to a current frequency divider value. Modification of the period of the feedback signal entails, in this example, using both a selected phase output and a selected corresponding frequency divider value, where the corresponding frequency divider value is used to modify the current frequency divider value to create a resultant frequency divider value that is used to divide a frequency of a phase outputs. Additionally, the memory can be used for both slewing of clock frequency and spreading of clock frequency. Spreading of clock frequency creates a number of clock frequencies around a nominal frequency in order to reduce peak power at the nominal frequency. The memory can contain values suitable for slewing both up and down in frequency. Alternatively, the memory can contain values suitable for slewing down in frequency and the clock generation circuit can contain a circuit suitable to convert the values used when slewing down in frequency to values used when slewing up in frequency.

BRIEF DESCRIPTION OF THE DRAWINGS

FIG. 6 is an exemplary table used for showing how fractional frequency divider values can be used to make small changes in frequency of a clock signal;

FIG. 7 is an illustration of modifications performed by a down-to-up profile converter;

FIG. 8 is an example of program code used to create an exemplary implementation of the down-to-up profile converter;

FIG. 9 is an example of a memory entry in a memory used for slewing and spreading.

DETAILED DESCRIPTION

The present disclosure will first give an overview of frequency spreading for a clock signal, then give a description of exemplary clock generation circuits and methods of use thereof. An Appendix is also provided.

Overview of Frequency Spreading

One complication caused by clock signals is that these signals produce Electro-Magnetic Interference (EMI). EMI is regulated by the Federal Communications Commission (FCC), which has established rules as to how much EMI is allowed to be radiated from an electronic system at various frequencies. For example, for frequencies under 1 gigahertz (GHz), EMI is examined in 100 kilohertz (kHz) bandwidths. The FCC has also established techniques for measuring EMI at these bandwidths.

Manufacturers of electronic systems consequently have to design their electronic systems in accordance with the EMI requirements of the FCC. As clock frequencies have increased, the EMI radiated by clock signals has also increased. There are various techniques for reducing EMI radiated from clock signals. One such technique is spreading the clock signal frequencies used through spread spectrum techniques.

Figure 1A:
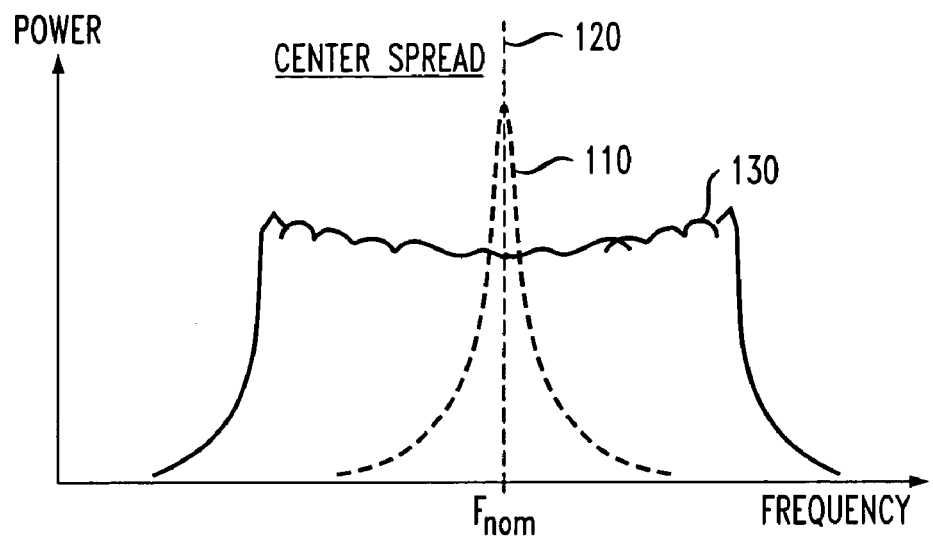
FIG. 1A is a graph of power spectral density illustrating a center spread clock signal and a conventional clock signal.

Spread spectrum for clock generation refers generally to a process whereby a clock signal that might be generated at a single frequency is, instead, generated at a relatively wide number of frequencies. There are different types of spread spectrum. Turning now to FIG. 1A, a graph illustrating a center spread type of spread spectrum is shown. Curve 110 is a power spectral density curve showing how power varies for the clock signal of a conventional clock generation circuit that outputs a single frequency. Although ideally this curve would be a very narrow curve, most clock generation circuits have some amount of non-ideal frequency response, which yields curve 110. Curve 130 is a power spectral density curve generated by using spread spectrum techniques using center spreading. Center spreading provides a range of clock frequencies centered around a center frequency, called nominal clock frequency ($F_{nom}$) 120 in this example.

Figure 1B:
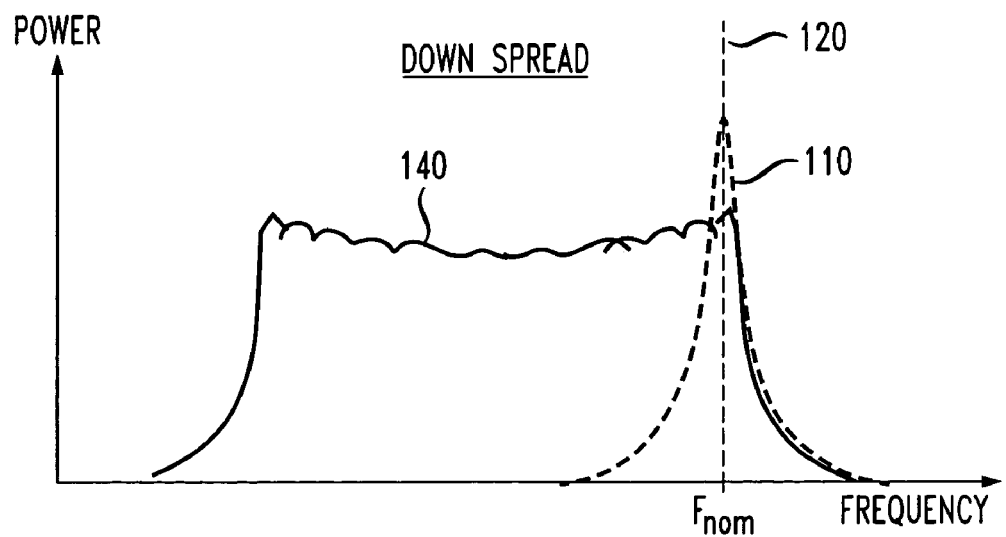
FIG. 1B is a graph of power spectral density illustrating a down spread clock signal and a conventional clock signal.

FIG. 1B shows a graph illustrating a down spread type of spread spectrum. When spreading, the spreading occurs downward from the nominal clock frequency 120. Spreading clock frequency from a nominal clock frequency downward some predetermined amount and then spreading back to the nominal clock frequency is called "down spreading" herein. Curve 140 illustrates a power spectral density curve created using down spreading. In this disclosure, it is assumed that down spreading is being used, but the circuits and methods provided herein may be adapted by one skilled in the art for any type of spread spectrum, such as center spreading.

What spread spectrum does is allow an electronic system to run near the nominal frequency yet have lower EMI at that nominal frequency. For example, if the nominal clock frequency, $F_{nom}$ 120 of FIG. 1A, is 1 GHz, a conventional electronic system might have a certain spectral energy in a 100 kHz band centered at 1 GHz but little spectral energy elsewhere, as shown by curve 110 in FIG. 1A. By contrast, an electronic system employing spread spectrum clock generation might have 50 percent less spectral energy in a 100 kHz band centered at 1 GHz but more spectral energy elsewhere as compared to the conventional electronic system, as shown by curve 130 of FIG. 1A. Even though there is more spectral energy elsewhere, the lower spectral energy at the 1 GHz frequency means that the EMI at that frequency is reduced as compared to a system not employing spread spectrum.

Exemplary Clock Generation Circuits and Methods of use Thereof

The present invention provides clock generation circuits that provide smooth slewing from an initial frequency to a final frequency for a clock signal output by a clock generation circuit. Additionally, the clock generation circuits can also spread the clock frequencies on the clock signal.

Figure 2:
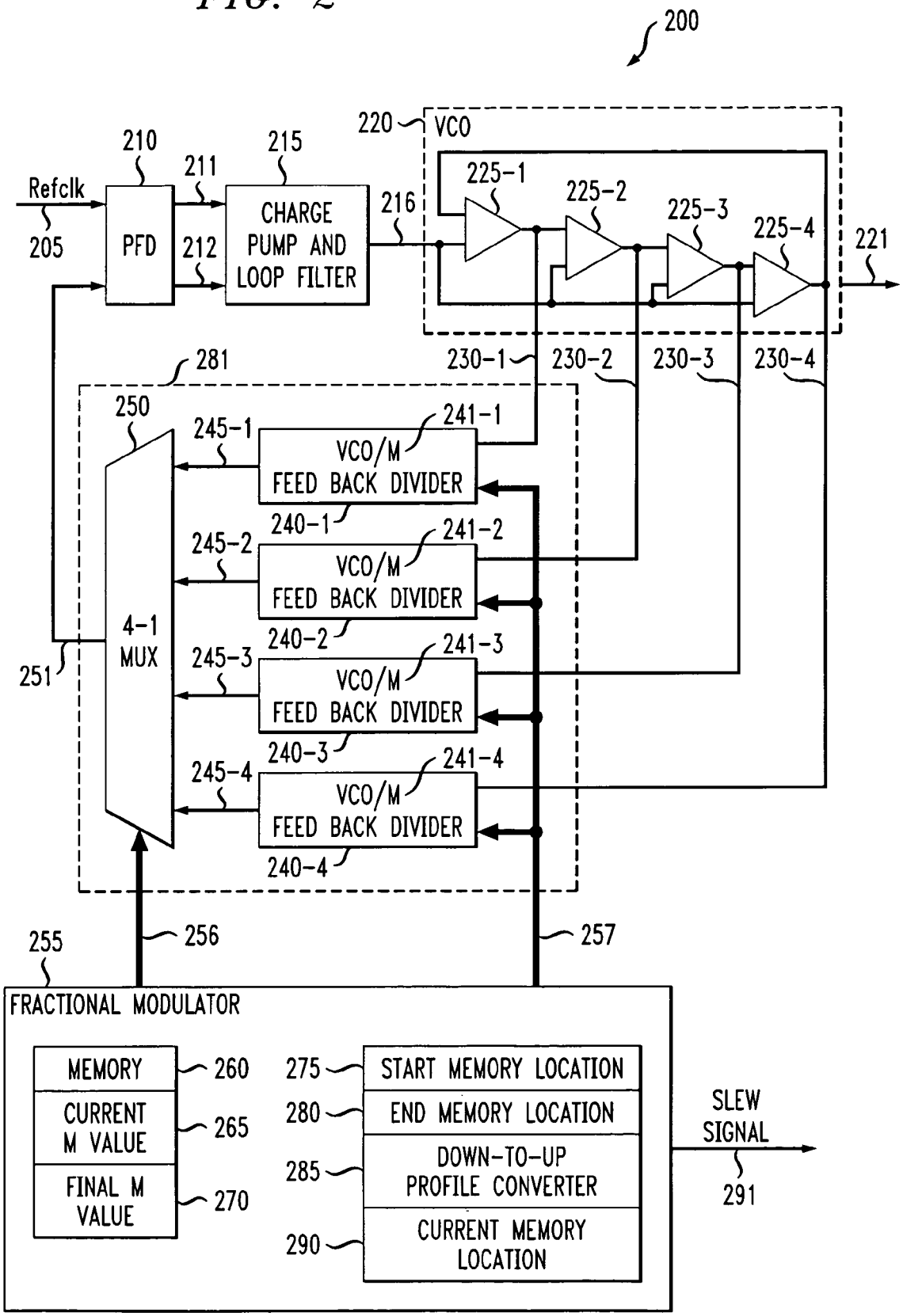
FIG. 2 is a block diagram of an exemplary clock generation circuit that is adapted to provide slewing from one clock frequency to another.

Turning now to FIG. 2, a block diagram is shown of an exemplary clock generation circuit 200 that provides slewing from one clock frequency to another. The term "slewing" refers to moving clock frequency from an initial clock frequency to a final clock frequency over a period of time, wherein the initial and final clock frequencies are not the same. For instance, in FIG. 1A or 1B above, the nominal frequency would be changed from an initial clock frequency to a final clock frequency. The clock generation circuit 200 can additionally use spread spectrum techniques to spread clock frequency. By way of example, the term "spreading" means that a spread spectrum technique (such as center spreading or down spreading) is used to spread a clock frequency on a clock signal at frequencies near a nominal frequency. In slewing, a nominal clock frequency is being changed for some, generally large, amount of time. Conversely, in spreading, a number of frequencies near a nominal frequency is being generated and the nominal frequency is not changed.

Clock generation circuit 200 comprises a Phase Frequency Detector (PFD) 210, a charge pump and loop filter module 215, a Voltage Controlled Oscillator (VCO) 220, a number of feedback divider modules 240-1 through 240-4, a multiplexer (MUX) 250, and a fractional modulator 255. Each feedback divider module 240 comprises a frequency divider value 241. Fractional modulator 255 comprises a memory 260, a current M value register 265, a final M value register 270, a start memory location register 275, an end memory location register 280, a down-to-up profile converter 285, and a current memory location register 290. Fractional modulator 255 produces a first control signal 256 and a second control signal 257.

The PFD 210 has inputs of a feedback signal 251 and a reference clock (Refclk) signal 205, and produces two PFD outputs 211 and 212. PFD outputs 211 and 212 are coupled to the charge pump and loop filter 215, the output 216 of which is provided to VCO 220. The PFD 210 compares a phase of the reference clock signal 205 with a phase of the feedback signal 251 and will produce PFD outputs 211 and 212, which are typically differential outputs labeled as UP and DOWN outputs, and the signals on the PFD outputs 211 and 212 correspond to a magnitude of phase difference between the reference clock signal 205 and the feedback signal 251. Charge pump and loop filter module 215 adds charge to or subtracts charge from a loop filter (not shown) in the charge pump and loop filter module 215, and generates a voltage on output 216 suitable for causing the VCO 220 to set its output clock frequency on clock signal 221. A VCO 220 is one type of oscillator. The PFD 210, charge pump and loop filter 215, and VCO 220 are known to those skilled in the art. For example, see F. Gardner, "Charge-Pump Phase-Locked Loops," IEEE Trans. Commun., vol. COM-28, 1849-1858 (1980), the disclosure of which is hereby incorporated by reference.

The VCO 220 comprises four inverters 225-1 through 225-4, each of which has a corresponding phase output 230-1 through 230-4. The VCO 220 produces a clock signal 221 suitable for coupling to other devices (not shown). The clock signal 221 is a buffered version of output phase 230-4, although the one or more buffers used to buffer the clock signal 221 are not shown.

Each phase output 230 is coupled to one of four feedback divider 240, each of which produces a corresponding divided phase output 245. Each feedback divider 240 has a frequency divider value 241, M, that is used to divide a frequency of a corresponding phase output 230. The divided phase outputs 245-1 through 245-4 are coupled to MUX 250, which couples one of the divided phase outputs 245 to feedback signal 251. The MUX 250 is directed by the fractional modulator 255, via first control signal 256, as to which divided phase output 245 should be coupled to the feedback signal 251. The fractional modulator 255 illustratively modifies, through techniques described in more detail below, period of the feedback signal 251 by, for example, selecting one of the phase outputs 230 and a corresponding frequency divider value 241 used in each of the feedback dividers 240. By way of example, the frequency divider value 241 can be a current frequency divider value (e.g., stored in current M value register 265) modified by a relative frequency divider value determined from memory 260, as described in more detail below. In an exemplary embodiment, selection of one of the phase outputs 230 and a corresponding frequency divider value 241 is performed multiple times to create a number of different periods in the feedback signal 251. Each feedback divider 240 receives, through the second control signal 257, the frequency divider value 241. Alternatively, each feedback divider 240 could receive an indication as to whether the frequency divider value 241 currently being used should be increased, be decreased, or remain the same. Illustratively, the fractional modulator 255 creates "fractional" periods on the feedback signal, as the fractional modulator 255 creates periods on the feedback signal that are between what could be created if only the frequency divider value 241 was changed.

The first control signal 256 corresponds to a selected phase output 230, which is typically indicated by a number. For example, the number three could indicate phase output 230-4. The first control signal 256 could have two signal lines, each of which would be active to indicate that phase output 230-4 should be selected. Alternatively, the first control signal 256 could comprise four signal lines, where the fourth signal line indicates that that phase output 230-4 should be selected. Any techniques for indicating which phase output 230 should be selected may be used. The second control signal 257 could have enough signal lines to pass the frequency divider value 241 to each of the feedback dividers 240, one or more signal lines indicating a change in frequency divider value 241 (e.g., by utilizing a relative frequency divider value from memory 260), or some combination of these. Any techniques for indicating or changing a frequency divider value 241 may be used. The fractional modulator 255 optionally produces a slew signal 291, which may be coupled to other components (not shown) to alert the components that the clock generation circuit 200 is slewing.

The frequency divider 240 is used to modify the clock frequency of the clock signal 221. An equation that describes this is the following: VCO frequency=Refclk frequency multiplied by M, where "VCO frequency" is the clock frequency of clock signal 221. A conventional Phase Locked Loop (PLL) would comprise the PFD 210, the charge pump and loop filter 215, the VCO 220, and a single feedback divider 240 having a feedback signal 251. It should be noted that some implementations of clock generation circuit 200 could have a modulating waveform input to a summing device, the summing device intermediate (e.g., on the output 216) the charge pump and loop filter 215 and the VCO 220.

The memory 260 holds entries suitable for selecting phases (e.g., corresponding to the divided phase outputs 245 and the phase outputs 230) and frequency divider values 241 in order to perform spreading and slewing. In an exemplary embodiment, a relative frequency divider value is stored in memory 260, as explained below. By way of example, half of memory 260 can be used, during down spreading, to hold entries for spreading from a nominal frequency to a lower frequency by modifying a period of the feedback signal 251 and the other half of memory 260 can be used to hold entries for spreading from the lower frequency to the nominal frequency by modifying a period of the feedback signal 251. Additionally, depending on implementation, only part of the memory 260 might be used during spreading. This is described in more detail below.

In an exemplary embodiment, the frequency divider value 241 is changed to modify a period of the feedback signal 215, thereby effecting a frequency change in the frequency of the clock signal 221. When modifying the period of the feedback signal 251, the frequency divider value 241 in the feedback divider 240 is typically not permanently changed, but is instead temporarily changed to create and maintain a particular period for the feedback signal 251. This is described in reference to FIGS. 3A, 3B, 3C and 4. Briefly, a period of the feedback signal 251 is modified in order to cause a change in frequency of the clock signal 221. For example, when down spreading or slewing down using four phases of the feedback signal 251 (e.g., and the VCO 220), the phase of the feedback signal 251 will be changed from an initial phase to a decrease in phase of a single phase, then to a decrease in phase of two phases, until a predetermined phase decrease of three (e.g., or four) phases is met. Each phase change modifies the period of the feedback signal 251 and create a frequency change in the output of the clock signal 221. When down spreading, the phase of the feedback signal 251 is again changed from the predetermined phase change of three phases, to a phase change of two phases, to a phase change of one phase, then back to no phase change.

The memory 260 is also used for slewing from an initial frequency to a final frequency. During slewing down in frequency, when a final phase for the feedback signal 241 is reached, typically for a predetermined time, the frequency divider value 241 (e.g., and the frequency divider value in current M value register 265) is changed and output to the frequency dividers 240. Modification of the period of the feedback signal 251 is again performed. This process is continued until a final frequency divider value (e.g., stored in final M value register 270) is reached. Thus, the frequency divider value 241 is changed when slewing down in frequency to provide a permanent change in nominal clock frequency of the clock signal. Slewing down in frequency is called "down slewing" herein, and slewing up in frequency is called "up slewing" herein. In an exemplary embodiment, the current frequency divider value is stored in the current M value register 265, and the final frequency divider value is stored in the final M value register 270.

Typically, a portion or all of the memory 260 is used when down spreading. For example, in an exemplary embodiment, a first half of the memory 260 is used to decrease clock frequency from a nominal clock frequency to a predetermined final down-spread frequency when down spreading and a second half of the memory 260 is used to increase the frequency from the final down-spread frequency to the nominal clock frequency.

During down slewing, in an exemplary embodiment, the first half of the memory 260 is used multiple times in order to change the nominal clock frequency from an initial clock frequency to a final clock frequency. Thus, in this exemplary embodiment, the start memory location register 275 can be used to determine where to start in the memory for down slewing, and the end memory location register 280 can be used to determine where to end in the memory 260 when down slewing. When up slewing, the down-to-up profile converter 285, in an exemplary embodiment, converts the entries in the first half of the memory 260 used during down slewing to values suitable for use in up slewing. The down-to-up profile converter 285 is used in one exemplary embodiment so that space is saved, as memory takes a large amount of space relative to the down-to-up profile converter 285. However, entries in memory 260 could be used to implement up slewing.

Although only four feedback dividers 240 are shown, more or less may be used. More feedback dividers 240 can provide smoother spreading and slewing, and typically eight or 16 feedback divider 240 will be used. Having more feedback divider 240 requires a MUX able to select the appropriate number (i.e., eight or 16) phases and the appropriate VCO 220 to generate the appropriate number (i.e., eight or 16) of phases. Additionally, different types of VCOs 220 can have different outputs and number of stages. For example, some individual stages of VCOs 220 can produce two phase outputs. Thus, 16 phases might be produced by eight stages in an exemplary VCO 220.

Furthermore, the MUX 250 could be placed before the feedback divider 240, which would mean that only one feedback divider 240 would be necessary. Thus, the block 281 could be considered a feedback divider and multiplexer circuit 281, where the feedback divider and multiplexer circuit 281 performs both the frequency division (e.g., by using a frequency divider value) and selection of a phase in order to effect modification of the period on feedback signal 251.

It should be noted that typical feedback dividers 240 may have frequency divider values 241 that are different than the frequency divider values described herein. For example, a conventional feedback divider 240 might be an "M+3" feedback divider 240, which means that to create a frequency divider value of 50 in an M+3 feedback divider 240, the frequency divider value of 47 would be input to the feedback divider 240. The value of 47 (e.g., and not 50) would generally be stored in memory 260 when an M+3 feedback divider is used. Additionally, conventional feedback dividers 240 such as an M+3 feedback divider have a reset period when a new frequency divider value is read and used to divide frequency of a signal. In an exemplary embodiment, the frequency divider value is loaded to the feedback dividers 240 during the reset period.

Figures 3A, 3B:
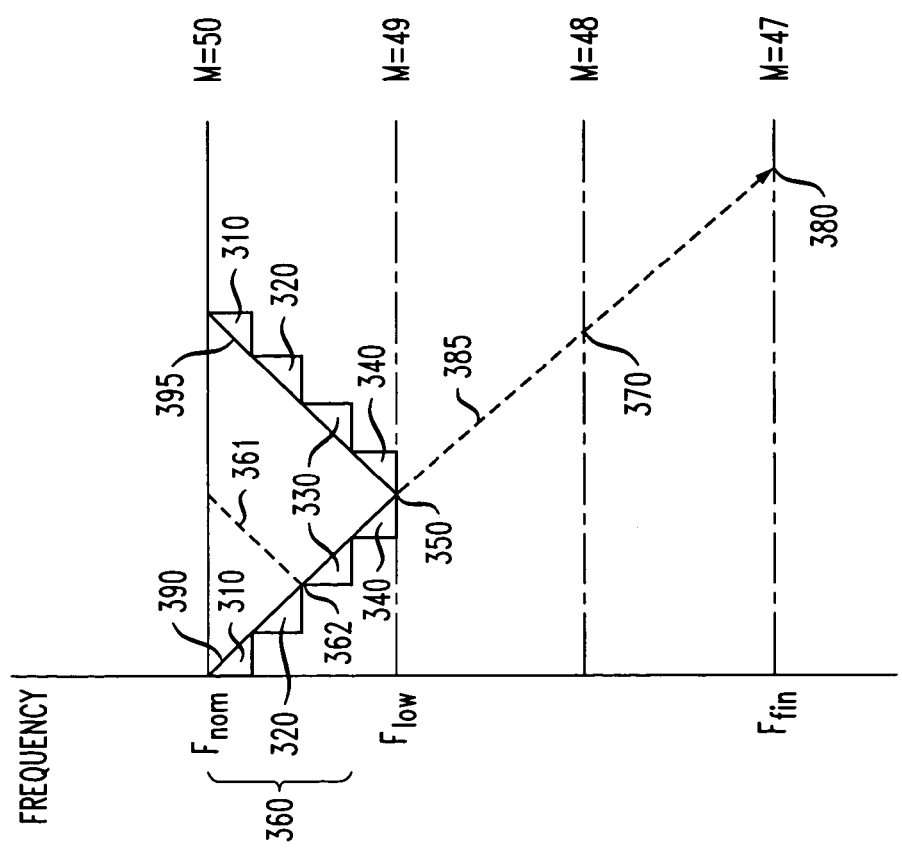
FIG. 3A is an example of spreading and slewing clock frequency curves for spreading and slewing downward in clock frequency, respectively.
FIG. 3B is a memory table used during spreading and slewing downward in clock frequency in FIG. 3A.
Figure 3C:
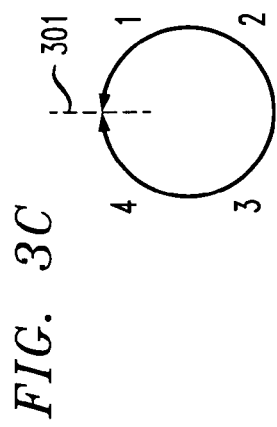
FIG. 3C is a circle diagram of frequency used to illustrate the potential need for changes in both a frequency divider value and a phase during transitions between certain phase outputs.

FIG. 3A is an example of spreading and slewing clock frequency curves for down spreading and down slewing, respectively. FIG. 3B is a memory table used during the down spreading and down slewing in FIG. 3A. FIG. 3C is a circle diagram of frequency used to illustrate the potential need for changes in both a frequency divider value and a phase during transitions between certain phases. FIGS. 3A, 3B and 3C will be used to describe down spreading for an exemplary embodiment, then will be used to describe how down slewing is performed in an exemplary embodiment.

Figure 10:
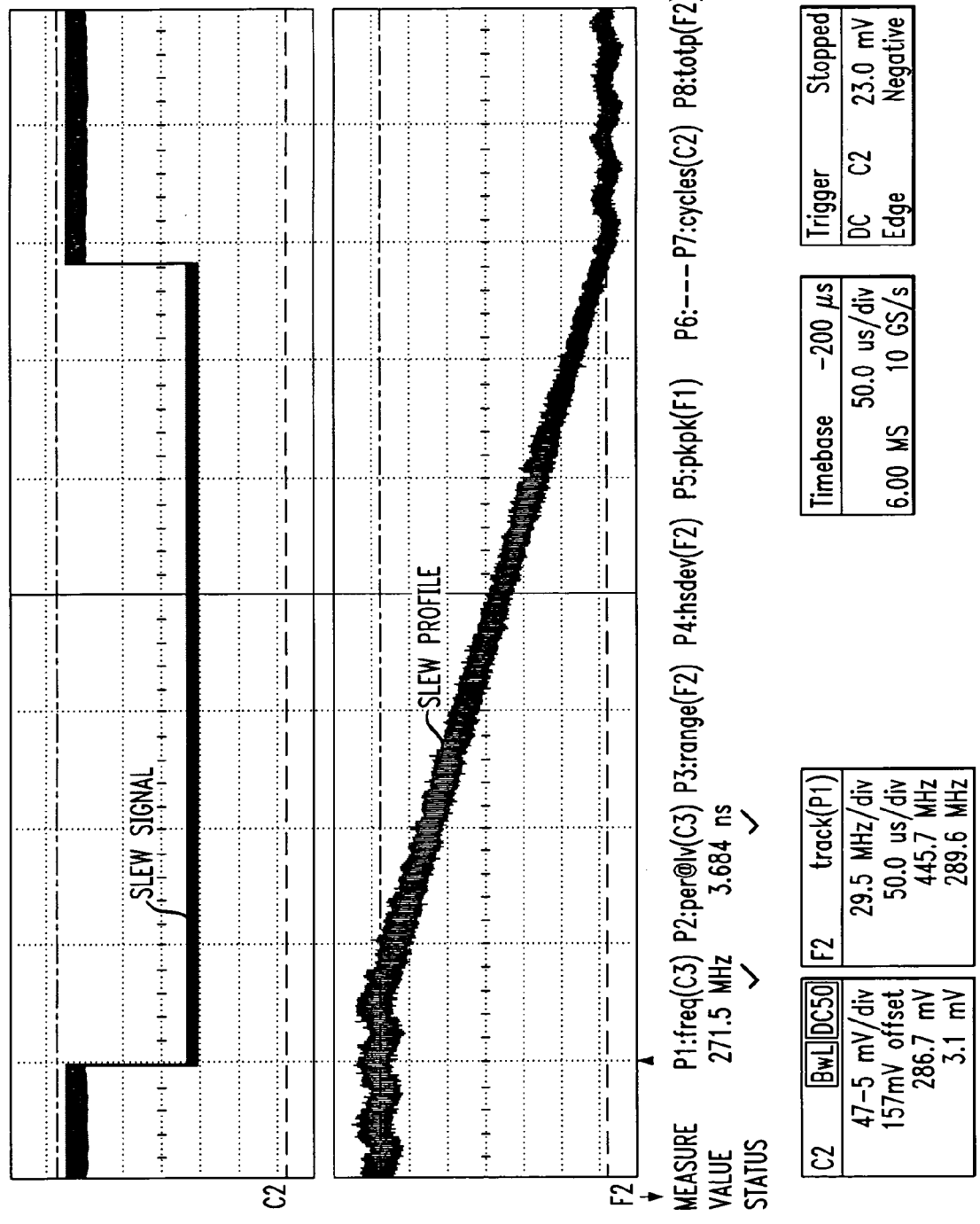
FIG. 10 shows exemplary graphs for a slew signal and a slew profile illustrating slewing downward in clock frequency.

FIG. 3A shows two frequency curves 390, 395 that represent ideal frequency curves for down spreading, and the approximation curves 310, 320, 330, 340 are representations of what happens when the frequency divider values and phase outputs are changed in order to modify a period of the feedback signal. It should be noted that the approximation curves 310, 320, 330, 340 are merely representations for exposition. An actual down slewing curve is shown in FIG. 10.

FIG. 3A also shows how the frequency divider value, M, corresponds to frequency. For curves 390 and 395, the frequency divider value is typically never permanently changed and is changed for one time period (as described in reference to FIG. 3B).

FIG. 3B shows a number of entries 317-1 through 317-16 in a memory table 300 (e.g., a portion of memory 260 of FIG. 1) for selecting the frequency divider value, M, 313 and the phase value 315. Each phase value 315 corresponds to one of the divided phase outputs 245, and this example uses four phases, one through four, and is used to select one of the divided phase outputs 245. Reference 311 corresponds to approximation 310 and shows the entries 317-1 through 317-4 used to create the approximation 310. Similarly, references 321, 331 and 341 correspond to approximations 320, 330 and 340, respectively, and show the entries 317-5 through 317-16 used to create these approximations. Each of the entries 317 is typically applied to the clock generation circuit 200 for a predetermined time period, called a cycle herein.

If the frequency divider value 313 were simply changed for spreading or slewing, there would too much of a phase jump and jitter would generally increase dramatically. Also, the clock generation circuit 200 (see FIG. 2) could become relatively unstable. Furthermore, changing the frequency divider value 313 leads to a large change in clock frequency, which might not be tolerable for many systems. Consequently, in order to make a frequency decrease without too much of a phase change, phase values 315 are modified through specific techniques, and this phase modification causes corresponding modification of the period of the feedback signal 251.

Figure 4:
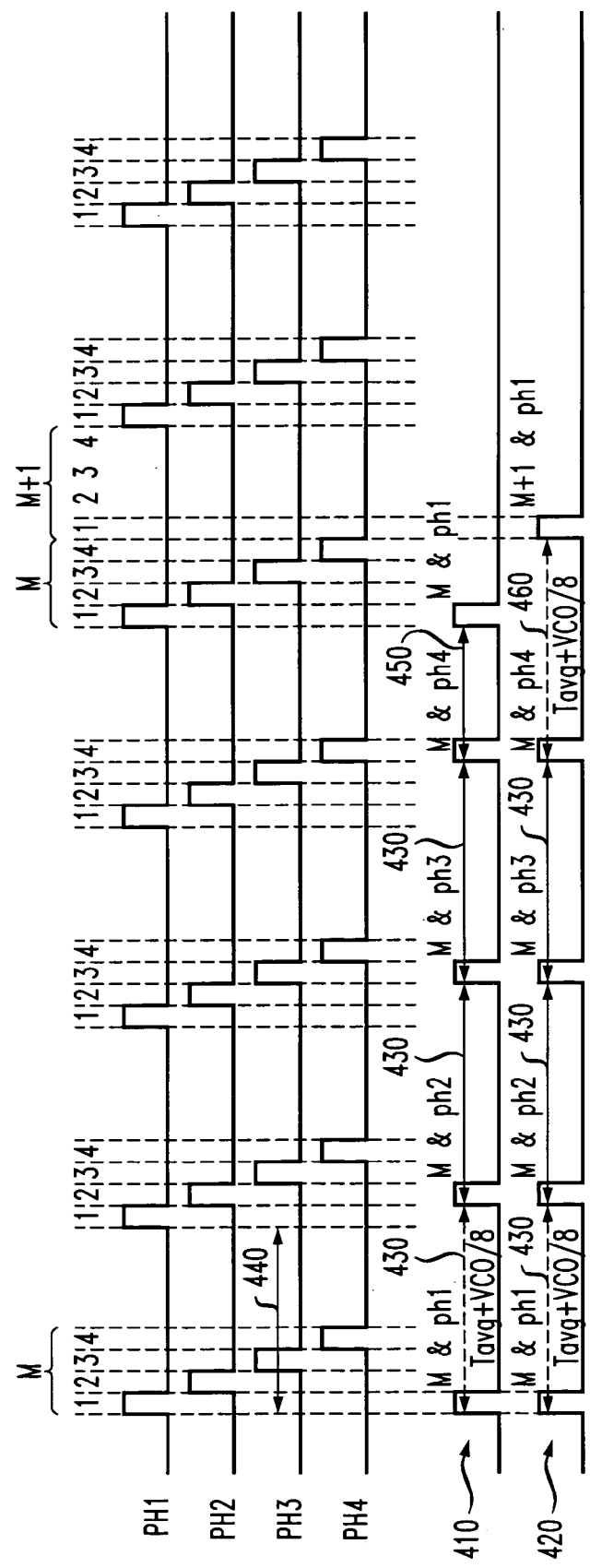
FIG. 4 contains a number of graphs used to illustrate the benefit of changing both a frequency divider value and a phase during transitions between certain phase outputs.

FIG. 3C shows a circle having phases one through four placed around the circumference. Whenever a phase change point 301 is passed, not only is the phase value 315 changed, but the frequency divider value 313 is also changed using a function of the current frequency divider value. The function is typically adding or subtracting a one from the current frequency divider value. Thus, when down spreading or down slewing is being performed the following phase modifications (e.g., a non-exhaustive list) should have both the phase value 315 and frequency divider value 313 modified: a phase modification from phase one to phase four; a phase modification from phase two to phase three; and a phase modification from phase four to phase four. Similarly, when up spreading or up slewing is being performed, the following phase modifications (e.g., a non-exhaustive list) should have both the phase value 315 and frequency divider value 313 modified: a phase modification from phase four to phase one; a phase modification from phase three to phase two; and a phase modification from phase four to phase four. FIG. 4, described below, provides waveforms to illustrate why both phase value 315 and the frequency divider value 313 are modified when passing phase change point 301.

In the entries 317 for reference 311, the phase values 317 are decreased by one each time, which means that the phase change on feedback signal 251 will initially have a change of one phase then will be maintained at a new phase change that is one phase from an initial phase. The phase change modifies the period of the feedback signal 251. Entry 317-1 starts with a frequency divider value 313 of 50 and a phase value 315 of one. As described above (and in reference to FIG. 4 below), when phase value 315 is modified from a phase value 315 of one to four in down spreading or down slewing, the frequency divider value 313 should also be modified in order to prevent a large phase change in the feedback signal 251. In entry 317-2 the frequency divider value 313 is modified from 50 to 49 (a relative modification, from a current M value, of minus one). Entry 317-2 therefore causes a phase change in the feedback signal 251, and the phase change modifies the period of the feedback signal 251. In entry 317-3, the phase value 315 is again decreased by one and the frequency divider value 313 is modified back to 50 (a relative modification, from a current M value, of zero). In entry 317-4, the phase value 315 is also decreased by one. The entries 317-3 and 317-4 maintain the period of the feedback signal 251.

In entries 317 for reference 321, the phase of the feedback signal 251 is decreased by two each time, which means that the phase change on feedback signal 251 will initially have a change of two phases relative to the initial phase (e.g., where the phase change is caused by entry 317-5) then will be maintained (e.g., by entries 317-6 through 317-8) at a new phase that is two phases from the initial phase. Thus, entry 317-5 modifies the period of the feedback signal 251 and entries 317-6 and 317-8 maintain the period. In entry 317-5, the frequency divider value 313 is modified from 50 to 49 because the phase value 315 is going from a phase of two to a phase of four (e.g., point 301 of FIG. 3C is being passed). In entry 317-6, the phase value 315 is again decreased by two and the frequency divider value 313 is modified back to 50. In entry 317-7, the frequency divider value 313 is modified from 50 to 49 because the phase value 315 is going from a phase of two to a phase of four (e.g., point 301 of FIG. 3C is being passed). In entry 317-8, the phase value 315 is again decreased by two and the frequency divider value 313 is modified back to 50.

In entries 317 for reference 331, the phase of the feedback signal 251 is decreased by three each time, which means that the phase change on feedback signal 251 will initially have a change of three phases relative to the initial phase (e.g., where the phase change is caused by entry 317-9) then will be maintained (e.g., by entries 317-10 through 317-12) at a new phase that is three phases from the initial phase. Thus, entry 317-9 modifies the period of the feedback signal 251 and entries 317-10 through 317-12 maintain the period. In entry 317-9, the frequency divider value 313 is modified from 50 to 49 because the phase value 315 is going from a phase of two to a phase of three (e.g., point 301 of FIG. 3C is being passed). In entry 317-10, the phase value 315 is again decreased by three and the frequency divider value 313 is modified back to 50. In entry 317-11, the frequency divider value 313 is kept at 50 and the phase 313 is decreased by three. In entry 317-12, the frequency divider value 313 is modified from 50 to 49 because the phase value 315 is going from a phase of one to a phase of two (e.g., point 301 of FIG. 3C is being passed).

In entries 317 for reference 341, the phase of the feedback signal 251 is decreased by four each time, which means that the phase change on feedback signal 251 will initially have a change of four phases relative to the initial phase (e.g., where the phase change is caused by entry 317-13) then will be maintained (e.g., by entries 317-14 through 317-15) at a new phase that is four phases from the initial phase. Thus, entry 317-3 modifies the period of the feedback signal 251 and entries 317-14 through 317-16 maintain the period. In this example, because the point 301 is being passed each time, the frequency divider value 313 for each of the entries in reference 341 is changed each cycle.

Thus, the entries 317 of FIG. 3A show how down spreading might be accomplished. The final down-spread clock frequency, Flow, (at point 350) is essentially a clock frequency that would occur at M=49. To create a lower clock frequency, the frequency divider value would be permanently changed by modifying the frequency divider value 241 and the value in current M value register 265 to 49.

It is possible to go back up memory table 300 in order to go up frequency curve 395. In other words, once entry 317-16 is reached, then entry 317-15 would be performed, entry 317-14 would be performed, and so on until entry 317-1 is reached. Typically, however, having an appropriate portion of memory 260 for spreading from $F_{low}$ to $F_{nom}$ is beneficial because then the curves 390 and 395 could be designed differently if desired. Additionally, although approximations 340 are shown as existing for the same amount of time as the other approximations 310, 320 and 330, the approximations 340 can exist for half the time as the other approximations, as this can make the "lobes" of a power spectral density curve at frequencies near $F_{low}$ be smaller. An example of entries, suitable for down spreading and down slewing, in a memory 260 is included as an appendix.

It should be noted that down spreading from a frequency divider value of 50 to a frequency divider value of 49 can be too much down spreading for some applications. For example, at 500 MHz using a reference clock of 10 megahertz (MHz), a decrease in the frequency divider value from 50 to 49 would be two percent down spreading. Some applications might require a lower amount of spreading. This type of application could then use only the down spreading determined using references 360 and 361, for example, which use approximations 310 and 320 and an equivalent set of approximations to spread from $f_{low}$ of 362 back to $f_{nom}$.

In down slewing, the fractional modulator 255 uses the memory table 300 and starts at location 317-1 (at M=50 and phase=1). Slewing then continues through location 317-16 to create part of slewing curve 385 (e.g., curve 390). After location 317-16, the frequency divider value 241 is permanently changed (e.g., by the fractional modulator 255) to M=49 and the value in current M value register 265 is decremented (from 50 to 49). Note that end memory location register 280 can be used to determine when the end of the memory table 300 has been reached. The fractional modulator 255 then continues at entry 317-1, which can be determined by using start memory location 275.

Once location 317-16 is reached again, the frequency divider value 241 is again permanently changed to M=48 and the value in current M value register 265 is decremented (from 49 to 48) by the fractional modulator 255. As described above, end memory location register 280 can be used to determine when the end of the memory table 300 has been reached. On the curve 385 shown in FIG. 3A, the circuit frequency will be at point 370. The fractional modulator 255 then continues at entry 317-1, which can be determined by using start memory location 275.

Once location 317-16 is reached again, the frequency divider value is permanently changed to M=48 and the value in current M value register 265 is decremented (from 48 to 47) by the fractional modulator 255. On the graph shown in FIG. 3A, the circuit frequency will be at point 380. The fractional modulator 255 compares the value in the current M value register 265 with the value in the final M value register 270, determines that the M values match, and then stops down slewing. The final clock frequency value, $F_{fin}$, has been reached in this example. Spreading may then be performed, if desired.

FIG. 3B also illustrates that relative frequency divider values can be stored instead of storing an entire frequency divider value. For instance, in entry 317-1, the relative frequency divider value 313 is zero and in entry 317-2, the relative frequency divider value 313 is negative one. These values can be used to modify the current frequency divider value (e.g., stored in current M value register 265) and a resultant frequency divider value output (e.g., through second control signal 257) to the feedback dividers 240. Alternatively, the relative frequency divider value could be output (e.g., through second control signal 257) to the feedback dividers 240, which could then modify a corresponding frequency divider value 241 in response to the relative frequency divider value.

The fractional modulator 255 could use a memory 200 or memory table 300 in order to perform up slewing. However, up slewing may also be performed by converting values in the memory 200 or memory table 300 to suitable values for up slewing. This is explained in more detail below.

FIG. 4 contains a number of graphs used to illustrate the benefit of changing both a frequency divider value and a phase (e.g., of the feedback signal 251) during transitions between certain phases. It should be noted that FIG. 4 is used for exposition purposes only and a true phase output diagram could be more complex than shown in FIG. 4. As shown in FIG. 3C, whenever transitioning past point 301, both the frequency divider value and the phase should be modified, and FIG. 4 provides another example of this. FIG. 4 shows waveforms for four phases PH1 through PH4 of the feedback signal 251. These are the phases suitable for selection at the divided phase outputs 245. As previously described, selecting one of the phases at the divided phase outputs 245 can change the phase of the feedback signal 251, and therefore modify the period of the feed back signal. Waveform 410 illustrates when only phase of the feedback signal 251 is changed, and waveform 420 illustrates when both the phase of the feedback signal 251 and the frequency divider value 241 are modified. It should be noted that FIG. 4 illustrates an up spreading or up slewing condition with four phases.

The period 430 is $T_{avg}$+VCO/4, where VCO is the current period of the VCO. Period 450 of waveform 410 is created when phase four is to transition to phase one, but the same frequency divider value is used. In this case, the period 450 is $T_{avg}$−VCO/3, which is a large phase difference from the period 430. Period 460 of waveform 420 is equivalent to period 430, which means that period 460 is $T_{avg}$+VCO/4. This is true because M is changed to M+1 and the phase was changed from phase four to phase one.

Waveform 420 also shows how a modification of the period of the feedback signal 251 occurs and how the period is maintained for a predetermined time. For instance, the selection of a corresponding to phase PH2 modifies the period of the feedback divider from $T_{avg}$ to $T_{avg}$+VCO/4. Subsequent phase selections and frequency divider value selections, if needed, maintain the period of $T_{avg}$+VCO/4.

Figure 5:
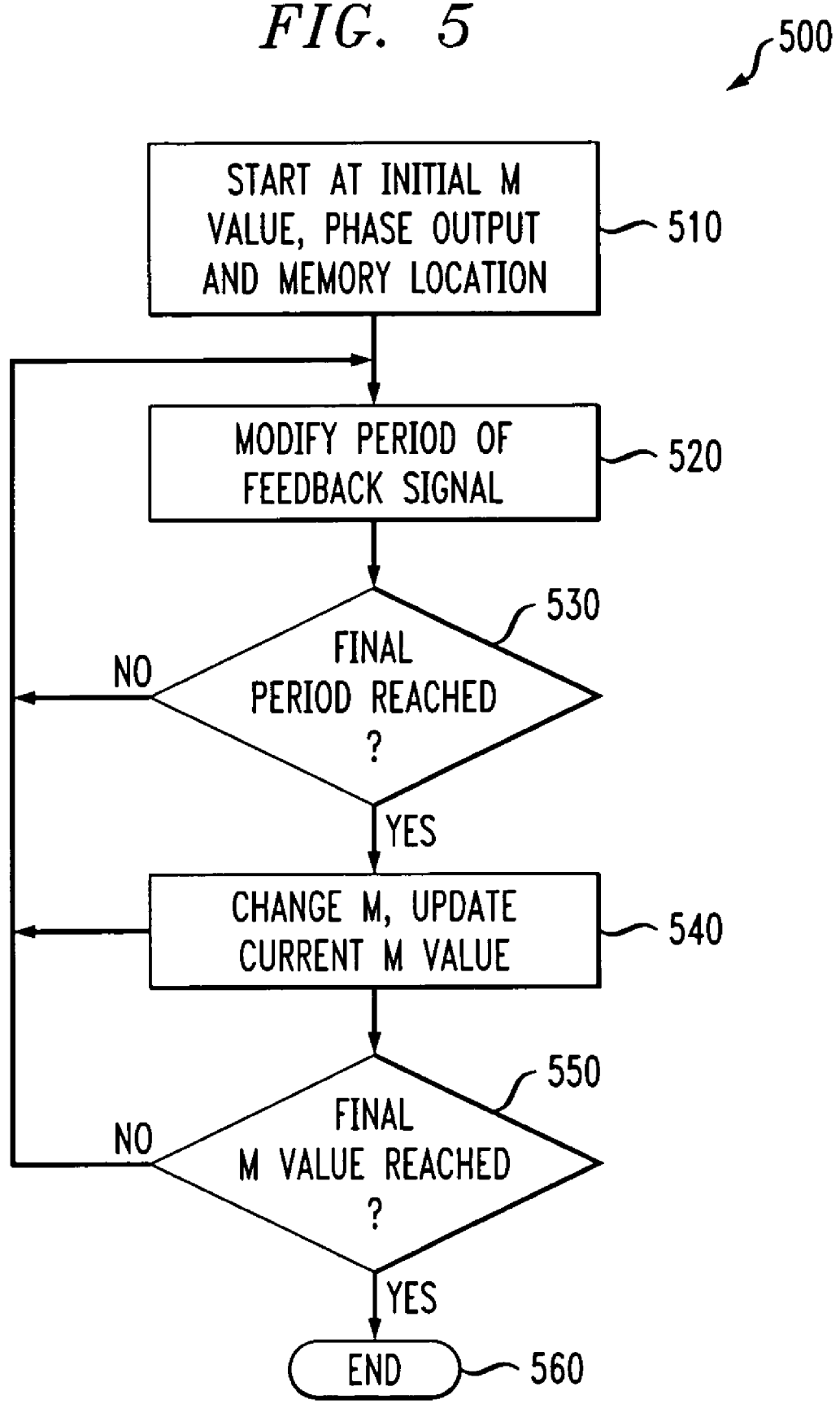
FIG. 5 is a flowchart of an exemplary method for slewing.

FIG. 5 is a flowchart of an exemplary method 500 for slewing. Method 500 is typically performed by fractional modulator 255. Method 500 begins in step 510, when the method 500 starts at an initial frequency divider value (corresponding to an initial clock frequency on the clock signal), phase (e.g., a phase output 230) of feedback signal 251 and a starting memory location (e.g., in start memory location register 275). In step 520, the period of the feedback signal 251 is modified. In an exemplary embodiment, step 520 is performed by retrieving from memory a new frequency divider value and phase value, and a memory reference (e.g., in current memory location register 290) is updated. The frequency divider value is coupled to the feedback divider 240, and the phase value is used to enable the MUX 250 to select one of the divided phase outputs 245 (e.g., or phase outputs 230). The frequency divider value stored in the memory can be a relative frequency value that is used to modify the current frequency divider value (e.g., stored in current M value register 265) and a resultant frequency divider value output to the frequency dividers. For instance, a current frequency divider value might be 50 and the relative frequency divider value could be zero, indicating that no change to the current frequency divider value is necessary.

In step 530, it is determined if a final period for the feedback divider 251 has been reached. In an exemplary embodiment, step 530 can be performed by determining if a final memory location has been reached (e.g., by comparing a current memory location in current memory location register 290 with end memory location register 280). If not (step 530=NO), the method 500 continues in step 520. If so (step 530=Yes), the method 500 continues in step 540. In step 540, the frequency divider value is permanently changed, and the current frequency divider value (e.g., in current M value register 265) is updated. In step 540, the frequency divider value is changed to effect a frequency change in the clock signal of the VCO. In step 550, it is determined if the final frequency divider value is reached. If not (step 550=NO), the method continues in step 520. If so (step 550=YES), the method 500 ends in step 560. Typically, spreading will begin once slewing ends.

It should be noted that a fractional frequency divider value can be considered to be created when phase of the feedback signal 251 is changed. For example, in FIG. 4, the phase was changed so that the period was $T_{avg}$+VCO/4. In that example, if M was 50, the "fractional M" equivalent could be considered to be 50.125, as the phase has been increased by one-fourth of an entire possible phase increase.

FIG. 6 is an exemplary table used for showing how "fractional" frequency divider values can be used to make small clock frequency changes in a clock signal. FIG. 6 is created using a clock generation circuit 200 where there are eight possible phases. Therefore, possible fractional frequency divider values can be multiples of 0.125. In portion 610 of FIG. 6, the fractional frequency divider value is M for three of the four periods and 49.875 (i.e., a down spread or down slew phase change of 0.125 phases, or one-eighth of an entire phase) for one time period, which in this example is four cycles. Each phase change modifies a period of the feedback signal. A phase change of 0.125 phases would yield a total fractional frequency divider value of 49.96875 for portion 620. Similarly, the total fractional frequency divider values for portions 620, 630 and 640 are 49.9375, 49.90625, and 49.875. Using this type of fractional frequency divider values can allow very fine clock signal frequency changes.

As described above, a memory 260 can contain both up slewing and down slewing information. For certain applications, such as systems where down spreading is being used, having a memory 260 contain additional information to support up slewing causes additional memory capacity to be necessary. Instead of this, the down slewing information in the memory 260 can be converted to be used with up slewing.

FIG. 7 is an illustration of modifications performed by a down-to-up profile converter 285 in order to convert entries in a memory 200 from down slewing to up slewing. The example of FIG. 7 uses a clock generation circuit 200 where there are eight possible phases from a VCO. Table 700 is a portion of memory 200, and table 710 is the portion 700 after the down-to-up profile converter 285 has converted the portion 700 for use in spreading up. In an exemplary embodiment, the down-to-up profile converter 285 ignores the frequency divider values in table 700. Instead, the down-to-up profile converter 285 maps the phases in table 700 to equivalent phases in table 710. For instance, phase 1 of table 700 is unchanged (see entry 717-1), phase eight is changed to phase two (see entry 717-2) and phase seven is changed to phase three (see entry 717-3). Entries 717-4 through 717-8 can be similarly determined. When the down-to-up profile converter 285 reaches phase eight (in entry 717-8), the down-to-up profile converter 285 is programmed so that the next phase in entry 717-9 is phase one, but the frequency divider value is temporarily modified by one (from M=50 to M=51) in order to maintain a period of the feedback signal 251. In entry 717-10, the down-to-up profile converter 285 modifies the frequency divider value back to 50 from 51 in order to maintain a period of the feedback signal 251.

Note that the current M value register 265, the final M value register 270, the start memory location register 275, the end memory location register 280, and the current memory location register 290 can be used by the fractional modulator 255 during up slewing.

FIG. 8 is an example of Verilog program code used to create an implementation of the down-to-up profile converter. As can be seen in FIG. 8, when the phase rolls over from phase seven to phase zero, the frequency divider value, called the M offset (MOFSET), will be increased to one, otherwise the frequency divider value will remain its current value. Typically, the frequency divider value in memory 200 is stored as an offset value from a current frequency divider value. This is shown in FIG. 9.

FIG. 9 is an example of a memory entry for an exemplary embodiment in a memory 200. Memory entry 900 has a single parity bit 910, three bits for a relative M value 920, and four bits for phase 930. The relative M value 920 in this example is stored using a format where the most significant bit indicates whether to add (e.g., the most significant bit is zero) or subtract (e.g., the most significant bit is one) the two least significant bits of the relative M value 920 from the current M value. For example, a value of 0x80 means that the phase 930 is phase zero (of eight, for example), the relative M value 920 is zero (e.g., the current M value in current M value register 265 is not changed), and the parity bit 910 is one for odd parity. A value of 0x57 means that the phase 930 is seven, the relative M value 920 of one is to be subtracted from the current M value, and the parity bit 910 is zero for odd parity. A value of 0x67 means that the phase 930 is seven, the relative M value 920 of two is to be subtracted from the current M value, and the parity bit 910 is zero for odd parity. As another example, 0x17 means that the phase 930 is seven, the relative M value 920 of one is to be added to the current M value, and the parity bit 910 is zero for odd parity.

FIG. 10 shows exemplary graphs for a slew signal and a slew profile illustrating down slewing in clock frequency. The slew signal (e.g., slew signal 291 of FIG. 2) is optionally produced during slewing by the fractional modulator 255. The slew profile shows spreading occurring, then down slewing from an initial frequency of 400 MHz to a final frequency of 275 MHz, and then spreading occurring at 275 MHz. FIG. 10 also illustrates a modulation rate, which is a rate at which spreading occurs. In FIG. 10, the distance between peaks is the modulation rate, which has been standardized to 30 kHz.

It should be noted that using a memory when slewing allows, for example, different slewing curves to be performed. For instance, certain frequency spectrum results might be desired during slewing and having a memory to store phase values and frequency divider values allows changes to be made to the frequency spectrum.

It is to be understood that the embodiments and variations shown and described herein are merely illustrative of the principles of this invention and that various modifications may be implemented by those skilled in the art without departing from the scope and spirit of the invention.

APPENDIX

The following table lists exemplary memory locations and entries for a memory 260 of an exemplary clock generation circuit 200 using eight phases and down spreading. The first half of the table (e.g., memory locations 5190 in hexadecimal to 5320 in hexadecimal) decrease effective clock frequency through modification of the period of the feedback signal 251, and the rest of the memory locations increase effective clock frequency through modification of the period of the feedback signal 251. The down-to-up profile converter 285 will typically use memory locations 5190 in hexadecimal to 5320 in hexadecimal during up slewing. Each of the following entries has a memory location and a value for the memory entry, each of which is written in hexadecimal. Each memory entry in this example is written in the format explained in reference to FIG. 9.

| | | | | | | | | | |
|---|---|---|---|---|---|---|---|---|---|
| 5190 | 0x80 | 5191 | 0x80 | 5192 | 0x80 | 5193 | 0x80 | 5194 | 0x80 |
| 5195 | 0x80 | 5196 | 0x80 | 5197 | 0x80 | 5198 | 0x80 | 5199 | 0x57 |
| 519a | 0x07 | 519b | 0x07 | 519c | 0x07 | 519d | 0x07 | 519e | 0x07 |
| 519f | 0x07 | 51a0 | 0x07 | 51a1 | 0x07 | 51a2 | 0x86 | 51a3 | 0x85 |
| 51a4 | 0x85 | 51a5 | 0x85 | 51a6 | 0x85 | 51a7 | 0x85 | 51a8 | 0x85 |
| 51a9 | 0x85 | 51aa | 0x85 | 51ab | 0x04 | 51ac | 0x83 | 51ad | 0x02 |
| 51ae | 0x02 | 51af | 0x02 | 51b0 | 0x02 | 51b1 | 0x02 | 51b2 | 0x02 |
| 51b3 | 0x02 | 51b4 | 0x01 | 51b5 | 0x80 | 51b6 | 0x57 | 51b7 | 0x86 |
| 51b8 | 0x86 | 51b9 | 0x86 | 51ba | 0x86 | 51bb | 0x86 | 51bc | 0x86 |
| 51bd | 0x85 | 51be | 0x04 | 51bf | 0x83 | 51c0 | 0x02 | 51c1 | 0x01 |
| 51c2 | 0x01 | 51c3 | 0x01 | 51c4 | 0x01 | 51c5 | 0x01 | 51c6 | 0x80 |
| 51c7 | 0x57 | 51c8 | 0x86 | 51c9 | 0x85 | 51ca | 0x04 | 51cb | 0x83 |
| 51cc | 0x83 | 51cd | 0x83 | 51ce | 0x83 | 51cf | 0x02 | 51d0 | 0x01 |
| 51d1 | 0x80 | 51d2 | 0x57 | 51d3 | 0x86 | 51d4 | 0x85 | 51d5 | 0x04 |
| 51d6 | 0x04 | 51d7 | 0x04 | 51d8 | 0x83 | 51d9 | 0x02 | 51da | 0x01 |
| 51db | 0x80 | 51dc | 0x57 | 51dd | 0x86 | 51de | 0x85 | 51df | 0x04 |
| 51e0 | 0x04 | 51e1 | 0x83 | 51e2 | 0x02 | 51e3 | 0x01 | 51e4 | 0x80 |
| 51e5 | 0x57 | 51e6 | 0x86 | 51e7 | 0x85 | 51e8 | 0x04 | 51e9 | 0x83 |
| 51ea | 0x02 | 51eb | 0x01 | 51ec | 0x80 | 51ed | 0x57 | 51ee | 0x86 |
| 51ef | 0x85 | 51f0 | 0x04 | 51f1 | 0x83 | 51f2 | 0x02 | 51f3 | 0x01 |
| 51f4 | 0x80 | 51f5 | 0x57 | 51f6 | 0x86 | 51f7 | 0x85 | 51f8 | 0x04 |
| 51f9 | 0x83 | 51fa | 0x02 | 51fb | 0x01 | 51fc | 0x80 | 51fd | 0xd6 |
| 51fe | 0x85 | 51ff | 0x04 | 5200 | 0x83 | 5201 | 0x02 | 5202 | 0x01 |
| 5203 | 0x80 | 5204 | 0x57 | 5205 | 0x86 | 5206 | 0x04 | 5207 | 0x02 |
| 5208 | 0x01 | 5209 | 0x80 | 520a | 0x57 | 520b | 0x86 | 520c | 0x85 |
| 520d | 0x04 | 520e | 0x83 | 520f | 0x01 | 5210 | 0x57 | 5211 | 0x85 |
| 5212 | 0x04 | 5213 | 0x83 | 5214 | 0x02 | 5215 | 0x01 | 5216 | 0x80 |
| 5217 | 0x57 | 5218 | 0x85 | 5219 | 0x83 | 521a | 0x01 | 521b | 0x57 |
| 521c | 0x86 | 521d | 0x04 | 521e | 0x04 | 521f | 0x83 | 5220 | 0x02 |
| 5221 | 0x80 | 5222 | 0xd6 | 5223 | 0x04 | 5224 | 0x02 | 5225 | 0x80 |
| 5226 | 0x57 | 5227 | 0x86 | 5228 | 0x85 | 5229 | 0x04 | 522a | 0x02 |
| 522b | 0x80 | 522c | 0xd6 | 522d | 0x04 | 522e | 0x02 | 522f | 0x80 |
| 5230 | 0x57 | 5231 | 0x86 | 5232 | 0x85 | 5233 | 0x83 | 5234 | 0x01 |
| 5235 | 0x57 | 5236 | 0x85 | 5237 | 0x83 | 5238 | 0x01 | 5239 | 0x57 |
| 523a | 0x86 | 523b | 0x85 | 523c | 0x83 | 523d | 0x01 | 523e | 0x57 |
| 523f | 0x85 | 5240 | 0x83 | 5241 | 0x01 | 5242 | 0x57 | 5243 | 0x85 |
| 5244 | 0x04 | 5245 | 0x02 | 5246 | 0x80 | 5247 | 0xd6 | 5248 | 0x57 |
| 5249 | 0x02 | 524a | 0x80 | 524b | 0xd6 | 524c | 0x04 | 524d | 0x02 |
| 524e | 0x80 | 524f | 0xd6 | 5250 | 0x04 | 5251 | 0x02 | 5252 | 0x80 |
| 5253 | 0xd6 | 5254 | 0x04 | 5255 | 0x02 | 5256 | 0x80 | 5257 | 0xd6 |
| 5258 | 0x04 | 5259 | 0x02 | 525a | 0x80 | 525b | 0xd6 | 525c | 0x04 |
| 525d | 0x02 | 525e | 0x80 | 525f | 0xd6 | 5260 | 0x04 | 5261 | 0x01 |
| 5262 | 0x57 | 5263 | 0x85 | 5264 | 0x83 | 5265 | 0x01 | 5266 | 0x57 |
| 5267 | 0x85 | 5268 | 0x83 | 5269 | 0x01 | 526a | 0xd6 | 526b | 0x83 |
| 526c | 0x01 | 526d | 0x57 | 526e | 0x85 | 526f | 0x83 | 5270 | 0x01 |
| 5271 | 0x57 | 5272 | 0x85 | 5273 | 0x02 | 5274 | 0x57 | 5275 | 0x04 |
| 5276 | 0x02 | 5277 | 0x80 | 5278 | 0xd6 | 5279 | 0x04 | 527a | 0x02 |
| 527b | 0x80 | 527c | 0xd5 | 527d | 0x02 | 527e | 0x57 | 527f | 0x04 |
| 5280 | 0x02 | 5281 | 0x80 | 5282 | 0xd6 | 5283 | 0x04 | 5284 | 0x02 |
| 5285 | 0x57 | 5286 | 0x04 | 5287 | 0x01 | 5288 | 0xd6 | 5289 | 0x83 |
| 528a | 0x01 | 528b | 0x57 | 528c | 0x85 | 528d | 0x83 | 528e | 0x80 |
| 528f | 0xd5 | 5290 | 0x02 | 5291 | 0x57 | 5292 | 0x04 | 5293 | 0x01 |
| 5294 | 0x57 | 5295 | 0x85 | 5296 | 0x83 | 5297 | 0x80 | 5298 | 0xd5 |
| 5299 | 0x02 | 529a | 0x57 | 529b | 0x04 | 529c | 0x01 | 529d | 0xd6 |
| 529e | 0x04 | 529f | 0x02 | 52a0 | 0x57 | 52a1 | 0x04 | 52a2 | 0x01 |
| 52a3 | 0xd6 | 52a4 | 0x83 | 52a5 | 0x80 | 52a6 | 0xd5 | 52a7 | 0x02 |
| 52a8 | 0x80 | 52a9 | 0xd5 | 52aa | 0x02 | 52ab | 0x57 | 52ac | 0x04 |
| 52ad | 0x01 | 52ae | 0xd6 | 52af | 0x83 | 52b0 | 0x80 | 52b1 | 0xd5 |
| 52b2 | 0x02 | 52b3 | 0x57 | 52b4 | 0x04 | 52b5 | 0x01 | 52b6 | 0xd6 |
| 52b7 | 0x83 | 52b8 | 0x80 | 52b9 | 0xd5 | 52ba | 0x02 | 52bb | 0x57 |
| 52bc | 0x04 | 52bd | 0x01 | 52be | 0xd6 | 52bf | 0x83 | 52c0 | 0x80 |
| 52c1 | 0xd5 | 52c2 | 0x02 | 52c3 | 0x57 | 52c4 | 0x02 | 52c5 | 0x80 |
| 52c6 | 0xd6 | 52c7 | 0x02 | 52c8 | 0x57 | 52c9 | 0x04 | 52ca | 0x01 |
| 52cb | 0xd6 | 52cc | 0x83 | 52cd | 0x80 | 52ce | 0x54 | 52cf | 0x80 |
| 52d0 | 0xd5 | 52d1 | 0x02 | 52d2 | 0x57 | 52d3 | 0x04 | 52d4 | 0x01 |
| 52d5 | 0xd6 | 52d6 | 0x02 | 52d7 | 0x57 | 52d8 | 0x83 | 52d9 | 0x57 |
| 52da | 0x04 | 52db | 0x01 | 52dc | 0xd6 | 52dd | 0x83 | 52de | 0x80 |
| 52df | 0xd5 | 52e0 | 0x01 | 52e1 | 0xd5 | 52e2 | 0x01 | 52e3 | 0xd5 |
| 52e4 | 0x02 | 52e5 | 0x57 | 52e6 | 0x04 | 52e7 | 0x01 | 52e8 | 0xd6 |
| 52e9 | 0x02 | 52ea | 0x02 | 52eb | 0x02 | 52ec | 0xd6 | 52ed | 0x02 |
| 52ee | 0x57 | 52ef | 0x04 | 52f0 | 0x01 | 52f1 | 0xd6 | 52f2 | 0x02 |
| 52f3 | 0xd6 | 52f4 | 0x02 | 52f5 | 0xd6 | 52f6 | 0x02 | 52f7 | 0xd6 |
| 52f8 | 0x83 | 52f9 | 0x80 | 52fa | 0xd5 | 52fb | 0x01 | 52fc | 0xd5 |
| 52fd | 0x01 | 52fe | 0xd5 | 52ff | 0x01 | 5300 | 0xd5 | 5301 | 0x01 |
| 5302 | 0xd6 | 5303 | 0x83 | 5304 | 0x57 | 5305 | 0x83 | 5306 | 0x57 |
| 5307 | 0x83 | 5308 | 0x57 | 5309 | 0x83 | 530a | 0x57 | 530b | 0x83 |
| 530c | 0x80 | 530d | 0x54 | 530e | 0x80 | 530f | 0x54 | 5310 | 0x80 |
| 5311 | 0x54 | 5312 | 0x80 | 5313 | 0x54 | 5314 | 0x80 | 5315 | 0x54 |
| 5316 | 0x80 | 5317 | 0x54 | 5318 | 0x80 | 5319 | 0x54 | 531a | 0x80 |
| 531b | 0x54 | 531c | 0x80 | 531d | 0x54 | 531e | 0x80 | 531f | 0x54 |
| 5320 | 0x80 | 5321 | 0x54 | 5322 | 0x80 | 5323 | 0x54 | 5324 | 0x80 |
| 5325 | 0x54 | 5326 | 0x80 | 5327 | 0x54 | 5328 | 0x80 | 5329 | 0xd3 |
| 532a | 0x57 | 532b | 0x83 | 532c | 0x57 | 532d | 0x83 | 532e | 0x57 |
| 532f | 0x83 | 5330 | 0x57 | 5331 | 0x83 | 5332 | 0xd6 | 5333 | 0x01 |
| 5334 | 0xd5 | 5335 | 0x01 | 5336 | 0xd5 | 5337 | 0x01 | 5338 | 0xd5 |
| 5339 | 0x01 | 533a | 0xd5 | 533b | 0x80 | 533c | 0xd3 | 533d | 0xd6 |
| 533e | 0x02 | 533f | 0xd6 | 5340 | 0x02 | 5341 | 0xd6 | 5342 | 0x02 |
| 5343 | 0xd6 | 5344 | 0x01 | 5345 | 0x54 | 5346 | 0x57 | 5347 | 0x02 |
| 5348 | 0xd6 | 5349 | 0x02 | 534a | 0xd6 | 534b | 0x02 | 534c | 0xd6 |
| 534d | 0x01 | 534e | 0x54 | 534f | 0x57 | 5350 | 0x02 | 5351 | 0xd5 |
| 5352 | 0x01 | 5353 | 0xd5 | 5354 | 0x01 | 5355 | 0xd5 | 5356 | 0x80 |
| 5357 | 0xd3 | 5358 | 0xd6 | 5359 | 0x01 | 535a | 0x54 | 535b | 0x57 |
| 535c | 0x83 | 535d | 0x57 | 535e | 0x83 | 535f | 0xd6 | 5360 | 0x01 |
| 5361 | 0x54 | 5362 | 0x57 | 5363 | 0x02 | 5364 | 0xd5 | 5365 | 0x80 |
| 5366 | 0x54 | 5367 | 0x80 | 5368 | 0xd3 | 5369 | 0xd6 | 536a | 0x01 |
| 536b | 0x54 | 536c | 0x57 | 536d | 0x02 | 536e | 0xd5 | 536f | 0x80 |
| 5370 | 0x54 | 5371 | 0x57 | 5372 | 0x02 | 5373 | 0xd5 | 5374 | 0x80 |
| 5375 | 0xd3 | 5376 | 0xd6 | 5377 | 0x01 | 5378 | 0x54 | 5379 | 0x57 |
| 537a | 0x02 | 537b | 0xd5 | 537c | 0x80 | 537d | 0xd3 | 537e | 0x06 |
| 537f | 0x01 | 5380 | 0x54 | 5381 | 0x57 | 5382 | 0x02 | 5383 | 0xd5 |
| 5384 | 0x80 | 5385 | 0xd3 | 5386 | 0xd6 | 5387 | 0x01 | 5388 | 0x54 |
| 5389 | 0x57 | 538a | 0x02 | 538b | 0xd5 | 538c | 0x80 | 538d | 0x52 |
| 538e | 0xd5 | 538f | 0xd6 | 5390 | 0xd3 | 5391 | 0xd6 | 5392 | 0x01 |
| 5393 | 0x54 | 5394 | 0x57 | 5395 | 0x02 | 5396 | 0xd5 | 5397 | 0xd6 |
| 5398 | 0x01 | 5399 | 0x54 | 539a | 0x57 | 539b | 0x02 | 539c | 0xd5 |
| 539d | 0x80 | 539e | 0xd3 | 539f | 0xd5 | 53a0 | 0x57 | 53a1 | 0x01 |
| 53a2 | 0x54 | 53a3 | 0x57 | 53a4 | 0x02 | 53a5 | 0xd5 | 53a6 | 0x80 |
| 53a7 | 0xd3 | 53a8 | 0xd5 | 53a9 | 0x57 | 53aa | 0x01 | 53ab | 0xd3 |
| 53ac | 0xd6 | 53ad | 0x01 | 53ae | 0x54 | 53af | 0x57 | 53b0 | 0x02 |
| 53b1 | 0x54 | 53b2 | 0xd6 | 53b3 | 0x80 | 53b4 | 0x52 | 53b5 | 0x54 |
| 53b6 | 0x57 | 53b7 | 0x02 | 53b8 | 0xd5 | 53b9 | 0x80 | 53ba | 0x52 |
| 53bb | 0x54 | 53bc | 0xd6 | 53bd | 0x80 | 53be | 0x54 | 53bf | 0x54 |
| 53c0 | 0x57 | 53c1 | 0x02 | 53c2 | 0xd5 | 53c3 | 0x57 | 53c4 | 0x01 |
| 53c5 | 0xd3 | 53c6 | 0xd5 | 53c7 | 0x57 | 53c8 | 0x01 | 53c9 | 0xd3 |
| 53ca | 0xd6 | 53cb | 0x01 | 53cc | 0xd3 | 53cd | 0xd5 | 53ce | 0x57 |
| 53cf | 0x01 | 53d0 | 0x54 | 53d1 | 0xd5 | 53d2 | 0x57 | 53d3 | 0x01 |
| 53d4 | 0x54 | 53d5 | 0xd6 | 53d6 | 0x80 | 53d7 | 0x52 | 53d8 | 0x54 |
| 53d9 | 0xd6 | 53da | 0x80 | 53db | 0x52 | 53dc | 0x54 | 53dd | 0xd6 |
| 53de | 0x80 | 53df | 0x52 | 53e0 | 0x54 | 53e1 | 0xd6 | 53e2 | 0x80 |
| 53e3 | 0x52 | 53e4 | 0x54 | 53e5 | 0x57 | 53e6 | 0x02 | 53e7 | 0xd5 |
| 53e8 | 0x54 | 53e9 | 0xd6 | 53ea | 0x80 | 53eb | 0x52 | 53ec | 0x54 |
| 53ed | 0xd6 | 53ee | 0x80 | 53ef | 0x52 | 53f0 | 0x54 | 53f1 | 0xd5 |
| 53f2 | 0x57 | 53f3 | 0x01 | 53f4 | 0xd3 | 53f5 | 0xd5 | 53f6 | 0x57 |
| 53f7 | 0x01 | 53f8 | 0xd3 | 53f9 | 0xd5 | 53fa | 0x57 | 53fb | 0x01 |
| 53fc | 0x01 | 53fd | 0xd3 | 53fe | 0xd5 | 53ff | 0x57 | 5400 | 0x01 |
| 5401 | 0xd3 | 5402 | 0xd5 | 5403 | 0xd6 | 5404 | 0x57 | 5405 | 0x80 |
| 5406 | 0x52 | 5407 | 0x54 | 5408 | 0xd6 | 5409 | 0x80 | 540a | 0x52 |
| 540b | 0x54 | 540c | 0x54 | 540d | 0xd6 | 540e | 0x57 | 540f | 0x80 |
| 5410 | 0x52 | 5411 | 0x54 | 5412 | 0x54 | 5413 | 0x80 | 5414 | 0x52 |
| 5415 | 0xd3 | 5416 | 0x54 | 5417 | 0xd5 | 5418 | 0xd6 | 5419 | 0x57 |
| 541a | 0x01 | 541b | 0xd3 | 541c | 0xd5 | 541d | 0x57 | 541e | 0x80 |
| 541f | 0x51 | 5420 | 0x52 | 5421 | 0xd3 | 5422 | 0x54 | 5423 | 0xd5 |
| 5424 | 0x57 | 5425 | 0x01 | 5426 | 0x54 | 5427 | 0x54 | 5428 | 0xd5 |
| 5429 | 0xd6 | 542a | 0x57 | 542b | 0x80 | 542c | 0x51 | 542d | 0x52 |
| 542e | 0x54 | 542f | 0xd6 | 5430 | 0x57 | 5431 | 0x80 | 5432 | 0x51 |
| 5433 | 0x52 | 5434 | 0xd3 | 5435 | 0x54 | 5436 | 0xd5 | 5437 | 0xd6 |
| 5438 | 0x80 | 5439 | 0x51 | 543a | 0x52 | 543b | 0xd3 | 543c | 0x54 |
| 543d | 0xd5 | 543e | 0xd6 | 543f | 0x57 | 5440 | 0x80 | 5441 | 0x51 |
| 5442 | 0x52 | 5443 | 0xd3 | 5444 | 0x54 | 5445 | 0xd5 | 5446 | 0xd6 |
| 5447 | 0x57 | 5448 | 0x80 | 5449 | 0x51 | 544a | 0x52 | 544b | 0xd3 |
| 544c | 0x54 | 544d | 0xd5 | 544e | 0xd6 | 544f | 0xd6 | 5450 | 0x80 |
| 5451 | 0x51 | 5452 | 0x52 | 5453 | 0xd3 | 5454 | 0x54 | 5455 | 0x54 |
| 5456 | 0xd5 | 5457 | 0xd6 | 5458 | 0x57 | 5459 | 0x80 | 545a | 0x51 |
| 545b | 0x52 | 545c | 0xd3 | 545d | 0x54 | 545e | 0x54 | 545f | 0x54 |
| 5460 | 0xd5 | 5461 | 0xd6 | 5462 | 0x57 | 5463 | 0xd6 | 5464 | 0x51 |
| 5465 | 0x52 | 5466 | 0xd3 | 5467 | 0xd3 | 5468 | 0xd3 | 5469 | 0xd3 |
| 546a | 0x54 | 546b | 0xd5 | 546c | 0xd6 | 546d | 0x57 | 546e | 0x80 |
| 546f | 0x51 | 5470 | 0x51 | 5471 | 0x51 | 5472 | 0x51 | 5473 | 0x51 |
| 5474 | 0x52 | 5475 | 0xd3 | 5476 | 0x54 | 5477 | 0xd5 | 5478 | 0x06 |
| 5479 | 0xd5 | 547a | 0xd6 | 547b | 0xd6 | 547c | 0xd6 | 547d | 0xd6 |
| 547e | 0x57 | 547f | 0x80 | 5480 | 0x51 | 5481 | 0x52 | 5482 | 0x52 |
| 5483 | 0x52 | 5484 | 0x52 | 5485 | 0x52 | 5486 | 0x52 | 5487 | 0x52 |
| 5488 | 0xd3 | 5489 | 0xd5 | 548a | 0xd5 | 548b | 0xd5 | 548c | 0xd5 |
| 548d | 0xd5 | 548e | 0xd5 | 548f | 0xd5 | 5490 | 0xd5 | 5491 | 0xd5 |
| 5492 | 0xd6 | 5493 | 0x57 | 5494 | 0x57 | 5495 | 0x57 | 5496 | 0x57 |
| 5497 | 0x57 | 5498 | 0x57 | 5499 | 0x57 | 549a | 0x57 | 549b | 0x57 |
| 549c | 0x80 | 549d | 0xd0 | 549e | 0xd0 | 549f | 0xd0 | 54a0 | 0xd0 |
| 54a1 | 0xd0 | 54a2 | 0xd0 | 54a3 | 0xd0 | 54a4 | 0xd0 | 54a5 | 0xd0 |

-continued

| 54a6 | 0xd0 | 54a7 | 0xd0 | 54a8 | 0xd0 | 54a9 | 0xd0 | 54aa | 0xd0 |
|---|---|---|---|---|---|---|---|---|---|
| 54ab | 0xd0 | 54ac | 0xd0 | 54ad | 0xd0 | 54ae | 0xd0 | 54af | 0xd0 |

I claim:

1. A clock generation circuit for slewing a clock frequency from an initial clock frequency to a final clock frequency, the clock generation circuit comprising:
   an oscillator comprising a plurality of phase outputs; and
   a modulator coupled to the oscillator and adapted:
      to set a current frequency divider value to an initial frequency divider value, the initial frequency divider value corresponding to the initial clock frequency;
      to modify a period of a feedback signal through a plurality of periods from an initial period to a final period, the modify operation utilizing one or more of the plurality of phase outputs, wherein said initial period is different from said final period; and
      to change the current frequency divider value when the period of the feedback signal reaches the final period;
   wherein the modulator is adapted to perform the modify and change operations until the current frequency divider value reaches a final frequency divider value, the final frequency divider value corresponding to the final clock frequency.

2. The clock generation circuit of claim 1, wherein the clock generation circuit comprises a portion of an integrated circuit.

3. The clock generation circuit of claim 1, wherein:
   the modify operation increases the period of the feedback signal relative to the initial period and the change operation increases the current frequency divider value.

4. The clock generation circuit of claim 1, wherein:
   the modify operation decreases the period of the feedback signal relative to the initial period and the change operation decreases the current frequency divider value.

5. The clock generation circuit of claim 1, wherein the modulator is further adapted:
   to modify the period of the feedback signal by selecting, for each of the plurality of periods through which the period was modified, one or more of the plurality of phase outputs and a corresponding frequency divider value for each of the one or more phase outputs, each corresponding frequency divider value used to modify the current frequency divider value.

6. The clock generation circuit of claim 1, wherein the modulator further produces first and second control signals and wherein the clock generation circuit further comprises:
   a feedback divider and multiplexer circuit coupled to the plurality of phase outputs of the oscillator, adapted to receive the first and second control signals and producing the feedback signal, the feedback divider and multiplexer circuit adapted:
      to couple, based on the first control signal, a selected phase output as the feedback signal; and
      to divide a frequency of at least the selected phase output by a value equivalent to the current frequency divider value modified by a corresponding frequency divider value, the value corresponding to the second control signal.

7. The clock generation circuit of claim 1, wherein the oscillator comprises an input and the clock generation circuit further comprises:
   a Phase Frequency Detector (PFD) comprising at least one PFD output, a first input adapted to receive the feedback signal, and a second input adapted to receive a reference clock signal; and
   a charge pump and loop filter module having at least one input coupled to the at least one PFD output and an output coupled to the input of the oscillator.

8. The clock generation circuit of claim 1, wherein the modulator further comprises a memory comprising a plurality of entries, each entry comprising a phase value and a relative frequency divider memory value, wherein the modulator is further adapted, when performing each modify operation, to select one of the phase outputs by using a phase value from a given entry in the memory and to select a corresponding relative frequency divider value from the relative frequency divider memory value in the given entry.

9. The clock generation circuit of claim 1, wherein modification of the period of the feedback signal creates a fractional frequency divider value, wherein the modulator further comprises a memory comprising a plurality of entries, each entry comprising a phase value, wherein each of the modify operations is performed at least in part by accessing entries in the memory, wherein a portion of the entries in the memory is adapted to create fractional frequency divider values that decrease as the entries are traversed from a starting entry to an ending entry.

10. The clock generation circuit of claim 9, wherein the clock generation circuit further comprises a down-to-up profile converter adapted to convert phase values in the entries in the portion of memory from phase values that decrease as the entries are traversed from the starting entry to the ending entry to phase values that increase as the entries are traversed from the starting entry to the ending entry, wherein the down-to-up converter is also adapted to determine frequency divider memory values corresponding to certain of the phase values to modify the period of the feedback signal, the convert and determine operations adapted to create fractional frequency divider values that increase as the entries are traversed from the starting entry to the ending entry.

11. The clock generation circuit of claim 1, wherein modification of the period of the feedback signal creates a fractional frequency divider value, wherein the modulator further comprises a memory comprising a plurality of entries, each entry comprising a phase value, wherein each of modify operations is performed at least in part by accessing entries in the memory, wherein a portion of the entries in the memory is adapted to create fractional frequency divider values that increase as the entries are traversed from a starting entry to an ending entry.

12. The clock generation circuit of claim 1, wherein the modulator further comprises a memory comprising a plurality of entries, wherein the modulator further comprises a start memory location register and an end location register and wherein the modulator is further adapted, when performing the modify operations, to start at a start memory location from the start memory location register and end at an end memory location from the end memory location register.

13. The clock generation circuit of claim 12, wherein the modulator is further adapted to perform the change operation when the end memory location is reached.

14. The clock generation circuit of claim 1, wherein the modulator further produces first and second control signals and comprises a memory having at least one relative frequency divider value, the first control signal corresponds to one of the plurality of phase outputs, and the clock generation circuit further comprises:
  a plurality of feedback dividers, each feedback divider coupled to an associated one of the phase outputs, adapted to receive the second control signal and adapted to divide frequency of the associated phase output by a value corresponding to the second control signal to create a divided phase output, the value determined utilizing the current frequency divider value and a given one of the at least one relative frequency divider values; and
  a multiplexer coupled to each of the divided phase outputs, adapted to receive the first control signal and adapted to output, based on the first control signal, one of the divided phase outputs as the feedback signal.

15. The clock generation circuit of claim 1, wherein the modulator further produces first and second control signals and comprising a memory having at least one relative frequency divider value, the first control signal corresponds to one of the plurality of phase outputs, and the clock generation circuit further comprises:
  a multiplexer coupled to each of the phase outputs, adapted to receive the first control signal and adapted to couple, based on the first control signal, one of the phase outputs to a feedback divider as a multiplexer output; and
  the feedback divider coupled to the multiplexer output, adapted to receive the second control signal and adapted to divide frequency of the multiplexer output by a value corresponding to the second control signal to create the feedback signal, the value determined from the current frequency divider value and a given one of the at least one relative frequency divider values.

16. The clock generation circuit of claim 1, wherein modification of the period of the feedback signal creates a fractional frequency divider value, wherein the modulator is further adapted to perform a first modify operation so that a first fractional frequency divider value is created and to perform a second modify operation so that a second fractional frequency divider value is created, and wherein the first and second fractional frequency divider values are different.

17. The clock generation circuit of claim 16, wherein the difference comprises a predetermined fractional difference.

18. The clock generation circuit of claim 1, wherein the modulator is further adapted to modify the period of the feedback signal by selecting, for each modify operation for a period, at least two given phase outputs of the plurality of phase outputs and at least one given corresponding relative frequency divider value, wherein the modulator is adapted to select one of the at least one given corresponding frequency divider values to be a function of the current frequency divider value when a selected given phase output of the at least two given phase outputs passes a phase change point relative to a previously selected given phase output of the at least two given phase outputs.

19. The clock generation circuit of claim 1, wherein the plurality of periods is of a number equivalent to or less than that of the plurality of phase outputs.

20. The clock generation circuit of claim 1, wherein the modulator is further adapted to perform the modify operation in order to spread clock frequency between a nominal clock frequency and a lower down-spread clock frequency.

21. The clock generation circuit of claim 1, wherein the modulator is further adapted to perform the modify operation in order to spread clock frequency between a low clock frequency and a high clock frequency, each of the low and high clock frequencies being approximately equidistant from a nominal clock frequency.

22. The clock generation circuit of claim 1, wherein each of the initial and final clock frequencies comprises a nominal clock frequency.

23. An integrated circuit comprising:
  at least one clock generation circuit comprising:
  an oscillator adapted to generate a plurality of phase outputs; and
  a modulator coupled to the oscillator and adapted:
    to set a current frequency divider value to an initial frequency divider value, the initial frequency divider value corresponding to an initial clock frequency;
    to modify a period of a feedback signal through a plurality of periods from an initial period to a final period, the modify operation utilizing one or more of the plurality of phase outputs, wherein said initial period is different from said final period; and
    to change the current frequency divider value when the period of the feedback signal reaches the final period;
  wherein the modulator is adapted to perform the modify and change operations until the current frequency divider value reaches a final frequency divider value, the final frequency divider value corresponding to a final clock frequency.

24. The integrated circuit of claim 23, wherein the modulator further produces first and second control signals and comprises a memory having at least one relative frequency divider value, the first control signal corresponds to one of the plurality of phase outputs, and the clock generation circuit further comprises:
  a plurality of feedback dividers, each feedback divider coupled to an associated one of the phase outputs, adapted to receive the second control signal and adapted to divide frequency of the associated phase output by a value corresponding to the second control signal to create a divided phase output, the value determined utilizing the current frequency divider value and a given one of the at least one relative frequency divider values; and
  a multiplexer coupled to each of the divided phase outputs, adapted to receive the first control signal and adapted to output, based on the first control signal, one of the divided phase outputs as the feedback signal.

25. The integrated circuit of claim 23, wherein modification of the period of the feedback signal creates a fractional frequency divider value, wherein the modulator is further adapted to perform a first modify operation so that a first fractional frequency divider value is created and to perform a second modify operation so that a second fractional frequency divider value is created, and wherein the first and second fractional frequency divider values are different.

26. The integrated circuit of claim 23, wherein each of the initial and final clock frequencies comprises a nominal clock frequency.

27. A method for slewing a clock frequency from an initial clock frequency to a final clock frequency, the method comprising the steps of:
  providing a plurality of phase outputs of an oscillator;
  setting a current frequency divider value to an initial frequency divider value, the initial frequency divider value corresponding to the initial clock frequency;
  modifying a period of a feedback signal through a plurality of periods from an initial period to a final period, the modify operation utilizing one or more of the plurality of phase outputs, wherein said initial period is different from said final period; and changing the current frequency divider value when the period of the feedback signal reaches the final period;

wherein the steps of modifying and changing are performed until the current frequency divider value reaches a final frequency divider value, the final frequency divider value corresponding to the final clock frequency.

28. An integrated circuit comprising:

an oscillator adapted to generate a plurality of phase outputs; and a modulator coupled to the oscillator, comprising a memory having a plurality of first updated frequency divider values, and adapted:

to set a current frequency divider value to an initial frequency divider value, the initial frequency divider value corresponding to an initial clock frequency;

to modify a period of a feedback signal through a plurality of periods from an initial period to a final period, the modify operation utilizing one or more of the plurality of phase outputs and one or more of the first updated frequency divider values, wherein said initial period is different from said final period; and to change the current frequency divider value when the period of the feedback signal reaches the final period, the change operation creating a second updated frequency divider value;

wherein the modulator is adapted to perform the modify and change operations until the current frequency divider value reaches a final frequency divider value, the final frequency divider value corresponding to a final clock frequency; and one or more frequency dividers coupled to the modulator, each frequency divider adapted to divide one or more frequencies of one or more of the phase outputs by the first and second updated frequency divider values.

29. The integrated circuit of claim 28, wherein each of the initial and final clock frequencies comprises a nominal clock frequency.

30. The integrated circuit of claim 28, wherein the modulator is further adapted to perform the modify operation in order to spread clock frequency between a nominal clock frequency and one or more spread clock frequencies.

31. The integrated circuit of claim 30, wherein the modulator is further adapted to perform the change operation in order to spread clock frequency between the nominal clock frequency and the-one or more spread clock frequencies.

* * * * *